United States Patent
Okada et al.

(10) Patent No.: US 8,754,405 B2
(45) Date of Patent: Jun. 17, 2014

(54) ORGANIC ELECTROLUMINESCENCE DEVICE HAVING ANODE INCLUDING METAL OXIDE AND CONDUCTIVE POLYMER, LIGHT EMISSION APPARATUS, AND METHOD OF FABRICATING ORGANIC ELECTROLUMINESCENCE DEVICE

(75) Inventors: Yoshinori Okada, Kanagawa (JP); Hiroyuki Takahashi, Kanagawa (JP)

(73) Assignee: Ricoh Company, Ltd., Tokyo (JP)

(*) Notice: Subject to any disclaimer, the term of this patent is extended or adjusted under 35 U.S.C. 154(b) by 301 days.

(21) Appl. No.: 13/162,637

(22) Filed: Jun. 17, 2011

(65) Prior Publication Data
US 2011/0309347 A1    Dec. 22, 2011

(30) Foreign Application Priority Data

Jun. 17, 2010 (JP) ................................. 2010-138327
May 9, 2011 (JP) ................................. 2011-104676

(51) Int. Cl.
*H01L 51/00* (2006.01)

(52) U.S. Cl.
USPC ....... 257/40; 257/E51.027; 313/504; 313/503

(58) Field of Classification Search
CPC  H01L 51/5206; H01L 51/5012; C09K 11/06; Y10S 428/917
USPC ...................... 257/40; 313/504, 506; 428/917
See application file for complete search history.

(56) References Cited

U.S. PATENT DOCUMENTS

| | | |
|---|---|---|
| 5,723,873 A | 3/1998 | Yang |
| 5,882,761 A | 3/1999 | Kawami et al. |
| 6,284,393 B1 | 9/2001 | Hosokawa et al. |
| 6,383,666 B1 * | 5/2002 | Kim et al. ..................... 428/690 |
| 7,714,505 B2 | 5/2010 | Akai et al. |
| 2002/0159127 A1 | 10/2002 | Wehrmann et al. |
| 2005/0212413 A1 | 9/2005 | Matsuura et al. |
| 2005/0260445 A1 * | 11/2005 | Walters et al. ................ 428/690 |
| 2006/0222855 A1 | 10/2006 | Yasuda |
| 2010/0141566 A1 * | 6/2010 | Jung et al. ....................... 345/80 |
| 2010/0247923 A1 * | 9/2010 | Hsu .............................. 428/419 |

FOREIGN PATENT DOCUMENTS

| | | |
|---|---|---|
| JP | 09-148066 | 6/1997 |
| JP | 10-162959 | 6/1998 |
| JP | 2007-096270 | 4/2007 |
| JP | 2009193774 | 8/2009 |
| JP | 2010-040512 | 2/2010 |
| WO | WO 2009/044894 A1 | 4/2009 |
| WO | WO 2010/005009 | 1/2010 |

OTHER PUBLICATIONS

Extended European Search Report issued Oct. 10, 2011, in European Patent Application No. 11170174.4.

(Continued)

*Primary Examiner* — Eva Yan Montalvo
(74) *Attorney, Agent, or Firm* — Oblon, Spivak, McClelland, Maier & Neustadt, L.L.P.

(57) ABSTRACT

An organic electroluminescence device includes a cathode, a stacked structure provided on the cathode and including an organic layer that includes an organic light emitting layer, and a transparent anode provided on the stacked structure, The transparent anode includes a metal oxide and a conductive polymer.

10 Claims, 8 Drawing Sheets

(56) References Cited

OTHER PUBLICATIONS

Joerg Puetz, et al., "Direct gravure printing of indium tin oxide nanoparticle patterns on polymer foils", Thin Solid Films, vol. 516, No. 14, XP-023180388, May 30, 2008, pp. 4495-4501.

Office Action issued May 23, 2013 in European Patent Application No. 11 170 174.4.
European Office Action issued Feb. 2, 2014 in copending European Patent Application No. 11 170 174.4-1552, 4 pages.

* cited by examiner

ORGANIC ELECTROLUMINESCENCE DEVICE HAVING ANODE INCLUDING METAL OXIDE AND CONDUCTIVE POLYMER, LIGHT EMISSION APPARATUS, AND METHOD OF FABRICATING ORGANIC ELECTROLUMINESCENCE DEVICE

BACKGROUND OF THE INVENTION

1. Field of the Invention

The present invention relates to an organic electroluminescence device, a light emission apparatus, and a method of fabricating the organic electroluminescence device.

2. Description of the Background

Recently, active research and development have been made on organic electroluminescence devices (hereinafter simply referred to as EL (Electro-Luminescence) devices) that are self-emission type light emitting devices. Active research and development have also been made on light emission apparatuses that use the organic EL devices, such as surface emitting light sources, illumination devices, and display devices.

A typical organic EL device includes an anode, a cathode, and an organic layer that includes an organic light emitting layer and is sandwiched between the anode and the cathode. In the organic EL device, excitons are generated when the recombination of holes and electrons injected from the anode and the cathode occurs in an organic light emitting layer. Light having a wavelength corresponding to an energy band gap is emitted when the excitons return to the ground state.

In order to efficiently inject the electrons and the holes to the organic light emitting layer, a material having a relatively large work function is selected for the anode, and a material having a relatively small work function is selected for the cathode. A transparent conductive metal oxide, such as ITO (Indium Tin Oxide) and IZO (Indium Zinc Oxide, registered trademark), may be used for the anode. On the other hand, a metal, such as aluminum, magnesium, barium, cesium, and silver, or an alloy of such metals, may be used for the cathode.

The transparent conductive metal oxide is formed by vacuum deposition, such as sputtering. Hence, in order to prevent damage to the organic layer, including the organic light emitting layer, by the plasma or radiant heat when the transparent conductive metal oxide is formed, the transparent conductive metal oxide is usually formed before the organic layer. For this reason, the anode, the organic layer including the organic light emitting layer, and the cathode of the organic EL device are successively formed on a substrate in this sequence, as proposed in Japanese Laid-Open Patent Publications No. 9-148066, No. 10-162959, No. 2007-096270, and No. 2009-193774, for example. In other words, a lower electrode forms the anode, and an upper electrode forms the cathode.

The structure in which the lower electrode forms the anode and the upper electrode forms the cathode is suited for a bottom emission type organic EL device that emits the light from the substrate end of the device.

However, when the bottom emission type organic EL device is used for an active drive organic EL display device, a numerical aperture of each pixel becomes limited by a TFT (Thin Film Transistor) circuit or the like formed on the substrate. On the other hand, when the light is to be emitted from the organic EL device end on the opposite end from the substrate, the numerical aperture of each pixel will not be limited because no TFT circuit or the like is provided above the light emitting part. This latter type which emits light from the organic EL device end is referred to a top emission type.

In the top emission type organic EL device, the lower electrode is preferably made of a metal that is optically reflective, and the upper electrode is preferably made of a transparent conductive metal oxide that is transparent. This means that the lower electrode is preferably made of a material having a relatively small work function, and the upper electrode is preferably made of a material having a relatively large work function. In other words, the top emission type organic EL device that emits the light from the organic EL device end preferably has the so-called inverted stacked structure in which the lower electrode forms the cathode and the upper electrode forms the anode, as proposed in a Japanese Laid-Open Patent Publication No. 2010-040512, for example.

However, the following problems may be encountered in the organic EL device having the inverted stacked structure.

For example, when forming the transparent conductive metal oxide by the vacuum deposition such as sputtering in order to form the upper electrode that forms the anode, the organic layer underneath may be damaged during the sputtering to form the transparent conductive metal oxide.

According to the examples proposed in the Japanese Laid-Open Patent Publications No. 9-148066, No. 10-162959, and No. 2009-193774, the upper electrode is encapsulated by providing a buffer layer or a protection layer on the upper electrode by the vacuum deposition, in order to protect the upper electrode forming the cathode of the organic EL device having a structure other than the inverted stacked structure. However, if the buffer layer or the protection layer is provided between the organic layer and the upper electrode forming the anode in the organic EL device having the inverted stacked structure, it becomes difficult to inject the holes from the anode to the organic light emitting layer. Consequently, the luminous efficacy deteriorates, and a driving voltage required to drive the organic EL device increases.

On the other hand, according to the example proposed in the Japanese Laid-Open Patent Publication No. 2010-040512, the upper electrode forming the anode of the organic EL device is formed by printing a layer of conductive polymer, such as polyaniline and polythiophene, in place of the transparent conductive metal oxide. However, because conductive polymers generally absorb light in a visible region, it is difficult to increase the transmittance of the anode in this example. Furthermore, the conductive polymers have a small conductivity compared to that of the transparent conductive metal oxide, such as the ITO, and thus, it is difficult to increase the conductivity of the anode in this example.

SUMMARY OF THE INVENTION

Accordingly, it is an object of the present invention to provide a novel and useful organic electroluminescence device, light emission apparatus, and method of fabricating organic electroluminescence device, in which the problem described above may be suppressed.

Accordingly, the present invention provides an organic electroluminescence device that includes a cathode, a stacked structure provided on the cathode and including an organic layer that includes an organic light emitting layer, and a transparent anode provided on the stacked structure and including a metal oxide and a conductive polymer.

The present invention also provides a light emission apparatus that includes a substrate, and an organic electroluminescence device provided on the substrate, wherein the organic electroluminescence device includes a cathode provided on the substrate, a stacked structure provided on the cathode and including an organic layer that includes an organic light emitting layer, and a transparent anode provided on the stacked structure and including a metal oxide and a conductive polymer.

The present invention also provides a method of fabricating an organic electroluminescence device, that includes forming a cathode of a substrate, forming a stacked structure on the cathode, wherein the stacked structure includes an organic layer that includes an organic light emitting layer, and printing a transparent anode on the stacked structure, wherein the anode includes a metal oxide and a conductive polymer.

BRIEF DESCRIPTION OF THE DRAWINGS

Other objects and further features of the present invention will be apparent from the following detailed description when read in conjunction with the accompanying drawings, in which.

DETAILED DESCRIPTION OF THE INVENTION

Figure 1:
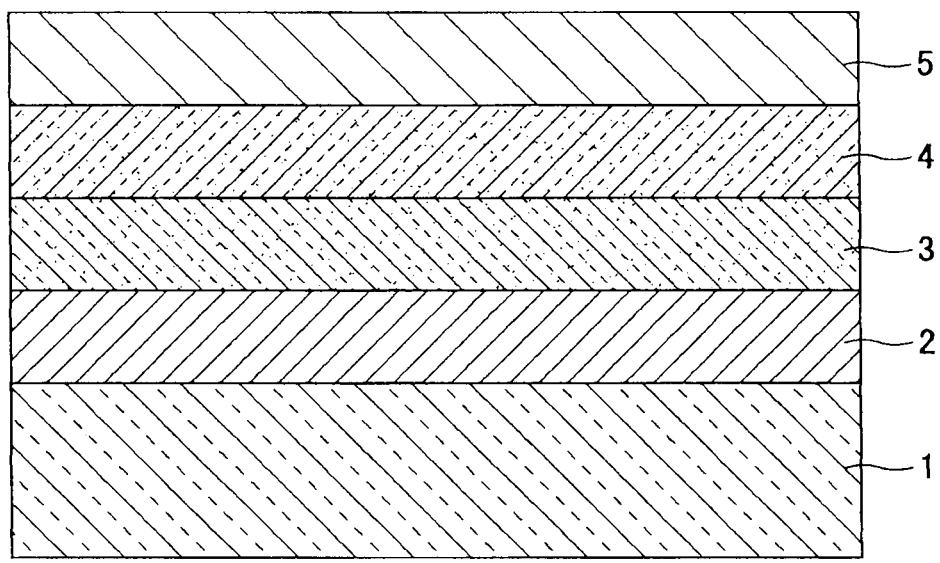
FIG. 1 is a cross sectional view illustrating a structure of an example of an organic EL device in a first embodiment of the present invention.

A description will be given of embodiments of the organic electroluminescence device, the light emission apparatus, and the method of fabricating organic electroluminescence device according to the present invention, by referring to the drawings.

First Embodiment

A description will be given of the organic EL device and the method of fabricating the same in a first embodiment of the present invention, by referring to FIGS. 1, 2A, 2B, and 3.

FIG. 1 is a cross sectional view illustrating a structure of an example of the organic EL device in the first embodiment of the present invention. As illustrated in FIG. 1, an organic EL device 10 includes a cathode 2, a stacked (or multi-layer) structure 3, a hole injecting layer 4, and an anode that are successively stacked on a substrate 1. The cathode 2 is formed on the substrate 1. The stacked structure 3 includes an organic layer, including an organic light emitting layer, that is stacked on the cathode 2. The hole injecting layer 4 is formed on the stacked structure 3. The anode 5 is printed on the stacked structure 3 having the hole injecting layer 4 formed thereon. The anode 5 includes a metal oxide and a conductive polymer, and is transparent.

The above described structure of the organic EL device 10 may enable the metal oxide and the conductive polymer to compensate for each other, in order to provide an organic EL device having a transparent anode with a high conductivity and a high transmittance. Hence, a high light extraction efficiency may be realized in the top emission type organic EL device 10 having the inverted stacked structure.

The substrate 1 may be made of any suitable material that will not be altered when forming the cathode 2, the stacked structure 3, or the like. For example, the substrate 1 may be formed by a glass substrate, a plastic substrate, a polymer film, a silicon substrate, a metal substrate such as a stainless steel substrate, and a laminated substrate that is formed by a combination of such substrate materials.

A lower electrode forming the cathode 2 may be made of a material having a small work function and enabling easy injection of electrons to the organic light emitting layer, a high electric conductivity, and a high reflectance in the visible light region. Examples of such a material forming the cathode 2 include alkaline metals, alkaline earth metals, transition metals, group 13 (or boron group) metals (for example, aluminum, magnesium, barium, cesium, etc.), and alloys including such metals (for example, magnesium-silver alloy, magnesium-indium alloy, magnesium-aluminum alloy, etc.).

In a case where a reflection layer is interposed between the cathode 2 and the substrate 1, the cathode 2 may be formed by a transparent conductor layer including a metal oxide or an organic material, a translucent conductor layer made of a metal, and the like. More particularly, a thin film of indium oxide, zinc oxide, tin oxide, ITO (Indium Tin Oxide), IZO (Indium Zinc Oxide), gold, platinum, copper, aluminum, polyaniline and derivatives thereof, polythiophene and derivatives thereof, and the like may be used for the cathode 2.

The thickness of the cathode 2 may be selected by taking into consideration the electrical conductivity, durability, and reflectance. For example, the thickness of the cathode 2 may be 10 nm to 10 μm, preferably 20 nm to 1 μm, and more preferably 50 nm to 500 nm. These ranges include all specific values and subranges therebetween, such as 25 nm, 75 nm, 100 nm, 250 nm, 750 nm, 2 μm, 3 μm, 5 μm and 8 μm.

If the thickness of the cathode 2 is less than 10 nm, the electrical conductivity may decrease or the durability may deteriorate, and the reliability of the cathode 2 may deteriorate or the reflectance of the cathode 2 may decrease. On the other hand, if the thickness of the cathode 2 exceeds 10 μm, the reliability of a pixel separation layer 7, which is formed on the cathode 2 and a wiring 6 connected to the cathode 2 and will be described later in conjunction with a second embodiment, may deteriorate.

The cathode 2 may be formed by vacuum deposition, sputtering, ion plating, laminating that performs compression bonding of a metal thin film, and the like. Alternatively, the cathode 2 may be printed using a functional liquid including a conductive polymer material, such as polyaniline or derivatives thereof and polythiophene or derivatives thereof, a liquid including a metal, such as nano-particle ink, paste and the like, a fusible metal in a melted state, and the like.

The stacked structure 3 including the organic layer, including the organic light emitting layer, that is stacked, may have a structure indicated in square brackets "[ ]" in the following layer structure (1).

(Anode)/[(Hole Injecting Layer)/(Hole Transport Layer)/(Electron Blocking Layer)/Organic Light Emitting Layer)/(Hole Blocking Layer)/(Electron Transport Layer)/(Electron Injecting Layer)]/(Cathode)  (1)

The stacked structure 3 requires at least the organic light emitting layer of the layer structure (1) described above, however, the other layers may be omitted or combined. For example, the hole injecting layer may also function as the hole transport layer, and the organic light emitting layer itself may also function as the electron transport layer.

In addition, the structure indicated in square brackets "[ ]" in the above layer structure (1) may form a repetition unit. In this case, a multi-photon type organic EL device may be formed by providing a charge generating layer between the repetition units. In other words, this embodiment may be applied to the organic EL device 10 having the following layer structure (2), where n is 1 or, n is a natural number greater than or equal to 2.

(Anode)/[(Repetition Unit)/(Charge Generating Layer)]n/(Repetition Unit)/(Cathode)  (2)

The organic layer including the organic light emitting layer and forming the stacked structure 3 may be formed by vacuum deposition, and may preferably be formed by printing. When printing the organic layer, the material used for the organic layer including the organic light emitting layer is preferably a polymer material, but various other suitable materials may be used, including a LMW (Low Molecular Weight) material mixed with a polymer binder. When using the polymer material for the organic light emitting layer, the following 2-layer structure (a) or 3-layer structure (b) may be used.

(Anode)/(Hole Injecting Layer)/(Light Emitting Layer)/(Cathode)  (a)

(Anode)/(Hole Injecting Layer)/(Interlayer)/(Light Emitting Layer)/(Cathode)  (b)

The layer structures (a) and (b) are relatively simple and easy to fabricate. When forming a large display device (or display panel) using the organic EL devices, the organic EL devices having the layer structure (a) or (b) may reduce the fabrication cost.

The organic light emitting layer preferably includes an organic material that makes fluorescent or phosphorescence light emission or, includes such an organic material and a dopant that aids the organic material. In addition, the organic light emitting layer more preferably includes a polymer compound of the conjugated system. Furthermore, in order to improve the charge transport characteristic, the organic light emitting layer may include a mixture of an electron transport compound or a hole transport compound. Accordingly, the following polymer materials, dye materials, metal complex materials, and dopant materials may be used for the organic light emitting material forming the organic light emitting layer.

The polymer material may include poly(p-phenylene vinylene) derivatives, polythiophene derivatives, poly(p-phenylene) derivatives, polysilane derivatives, polyacetylene derivatives, polyfluorene derivatives, polyvinylcarbazole derivatives, and polymers of the above described dye materials and metal complex light emitting materials.

The polymer material that enables blue light emission may include polyvinylcarbazole derivatives, poly(p-phenylene) derivatives, and polyfluorene derivatives. The polymer material that enables green light emission may include poly(p-phenylene vinylene) derivatives, and polyfluorene derivatives. The polymer material that enables red light emission may include poly(p-phenylene vinylene) derivatives, polythiophene derivatives, and polyfluorene derivatives.

For example, the dye material may include cyclopendamine derivatives, tetraphenylbutadiene derivatives, triphenylamine derivatives, oxadiazol derivatives, pyrazoloquinoline derivatives, distyrylbenzene derivatives, distyrylarylene derivatives, pyrrole derivatives, thiophene cyclic compound, pyridine cyclic compound, perinone derivatives, perylene derivatives, oligothiophene derivatives, trifumanylamine derivatives, oxadiazoledimer, pyrazolinedimer, and the like.

For example, the metal complex material may include iridium complex, metal complex having light emission from triplet excitation state of platinum complex or the like, aluminum quinolinol complex, benzoquinolinol beryllium complex, benzoxazolyl zinc complex, benzothiazole zinc complex, azomethyl zinc comples, porphyrin zinc complex, europium complex, and the like. In addition, the central metal may include metals such as Al, Zn, and Be or, rare-earth metals such as Tb, Eu, and Dy, and the ligand may include oxadiazol, thiadiazole, phenylpyridine, phenylbenzimidazole, metal complexes having quinoline structures, and the like.

For example, the dopant may include perylene derivatives, coumarin derivatives, rubrene derivatives, quinacridone derivatives, squarium derivatives, porphyrin derivatives, styryl dyes, tetracene derivatives, pyrazolone derivatives, decacyclene, phenoxazon, and the like.

The functional liquid for forming the organic layer including the organic light emitting layer may preferably include the material of the organic layer including the organic light emitting layer dissolved or dispersed within one of various solvents.

For example, the solvent used in the functional liquid that is used to form the organic layer including the organic light emitting layer may include toluene, xylene, mesitylene, tetralin, decalin, bicyclohexyl, hydrocarbon solvents such as n-butylbenzene, s-butylbenzene and t-butylbenzene, halogenated hydrocarbon solvents such as carbon tetrachloride, chloroform, dichloromethane, dichloroethane, chlorobutane, bromobutane, chloropentane, bromopentane, chlorohexane, bromohexane, chlorocyclohexane and bromocyclohexane, halogenated unsaturated hydrocarbon solvents such as chlorobenzene, dichlorobenzene, trichlorobenzene, ether solvents such as tetrahydrofuran, tetrahydropyran and dioxane, glycol solvents such as ethylene glycol and trimethylene glycol, ketone solvents such as acetone, methyl ethyl ketone, diethyl ketone, acetylacetone and isophorone, ester solvents such as ethylacetate, butylacetate and benzylacetate, ether alcohol solvents such as methoxyethanol and ethoxyethanol, amide solvents such as N,N-dimethylformamide and N,N-dimethylacetamide, alcohol solvents such as methanol, ethanol, isopropanol, butanol, ethylene glycol, propylene glycol, butoxyethanol and methoxbutanol, and water.

The functional liquid may include two or more kinds of solvents, and may include two or more kinds of solvents described above. In addition, the solvent included in the functional liquid may preferably be selected in order to prevent easy redissolving or redispersion of the layer underneath the layer that is being formed using the functional liquid.

The printing technique (or printing method) used to form the organic layer including the organic light emitting layer may include spin-coating, casting, micro-gravure coating, gravure coating, bar coating, roll coating, wirebar coating, dip coating, slit coating, capillary coating, spray coating, nozzle coating, gravure printing, screen printing, flexography printing, offset printing, reverse printing, inkjet printing, and the like.

Among the printing techniques described above, it may be preferable to use the gravure printing, the screen printing, the flexography printing, the offset printing, the reverse printing, and the inkjet printing to form the organic layer including the organic light emitting layer because of the ease with which patterns may be formed according to these printing techniques.

The hole injecting layer 4 may be formed by vacuum deposition, and may preferably be formed by printing. When printing the hole injecting layer 4, the material used for the hole injecting layer 4 is preferably polyaniline or derivatives thereof, polyfluorene or derivatives thereof, polyarylamine or derivatives thereof, polythiophene or derivatives thereof, and the like.

The functional liquid used to form the hole injecting layer 4 preferably includes the material of the hole injecting layer 4 dissolved or dispersed within one of various solutions. The solvent of the solution used for the functional liquid or, the solvent of the dispersant used for the functional liquid, may be the same as that used for the functional liquid used to form the organic layer including the organic light emitting layer. In addition, the printing technique used to form the hole injecting layer 4 may be the same as the printing technique used to form the organic layer including the organic light emitting layer.

The thickness of the hole injecting layer 4 may have an optimum value that differs depending on the material used therefor. The thickness of the hole injecting layer 4 may be selected so that values of the driving voltage and the luminous efficacy become appropriate, but at least no pin hole should be generated. It is undesirable for the hole injecting layer 4 to become too thick, because the driving voltage of the organic EL device would become high. Accordingly, the thickness of the hole injecting layer 4 is preferably 2 nm to 500 nm, and more preferably 5 nm to 50 nm. These ranges include all specific values and subranges therebetween, such as 10, 20, 25, 75, 100, 125, 150, 200, 250, 300 and 400 nm.

If the thickness of the hole injecting layer 4 is less than 2 nm, a pin hole may be generated, and the reliability of the organic EL device may deteriorate. On the other hand, if the thickness of the hole injecting layer 4 exceeds 500 nm, the driving voltage may become high.

An interlayer may be formed between the stacked structure 3 and the hole injecting layer 4. The interlayer may be made of a material including polyaniline or derivatives thereof, polythiophene or derivatives thereof, and the like.

The thickness of the interlayer may have an optimum value that differs depending on the material used therefor. The thickness of the interlayer may be selected so that values of the driving voltage and the luminous efficacy become appropriate, but at least no pin hole should be generated. It is undesirable for the interlayer to become too thick, because the driving voltage of the organic EL device would become high. Accordingly, the thickness of the interlayer is preferably 2 nm to 500 nm, and more preferably 5 nm to 50 nm. These ranges include all specific values and subranges therebetween, such as 10, 20, 25, 75, 100, 125, 150, 200, 250, 300 and 400 nm.

If the thickness of the interlayer is less than 2 nm, the pin hole may be generated, and the reliability of the organic EL device may deteriorate. On the other hand, if the thickness of the interlayer exceeds 500 nm, the driving voltage may become high.

The upper electrode forming the anode 5 may be made of a mixture of a metal oxide and a conductive polymer. The anode 5 may be formed by printing a functional liquid that is a mixture of a functional liquid including a metal oxide and a functional liquid including a conductive polymer.

The functional liquid in this embodiment is also referred to as a liquid.

The characteristics required of the upper electrode forming the anode 5 include having a large work function, having a high transmittance in the visible light region, having a high conductivity, and causing no damage to the organic layer when the anode 5 is formed. A preferable range of the work function of the anode may be 4.5 eV to 6.0 eV, and more preferably 4.7 eV to 5.5 eV. These ranges include all specific values and subranges therebetween, such as 4.6, 4.8, 4.9, 5.0, 5.2 and 5.8 eV.

If a difference between the work function of the anode and a work function of the organic layer including the organic light emitting layer is large, the height of the hole injection barrier becomes high, the driving voltage of the organic EL device increase, and the luminous efficacy may deteriorate. Accordingly, the work function of the anode may preferably set depending on the work function of the organic layer including the adjacent organic light emitting layer. In addition, a preferable range of the average transmittance in the visible light region may be 70% or greater and less than 100%, and more preferably 90% or greater and less than 100%. A preferable range of the conductivity may be $10^{-5}$ S/cm to $10^{5}$ S/cm, and more preferably $10^{-3}$ S/cm to $10^{5}$ S/cm. These ranges include all specific values and subranges therebetween.

In order to prevent damage to the stacked structure 3 when the printing technique is used to form the anode 5, a preferable process temperature required for the drying or sintering may be 150° C. or less, and more preferably 130° C. or less.

When the printing technique is used to form the anode 5 using a metal oxide such as ITO, for example, one of the following techniques (A) through (D) may be used, for example. The technique (A) dries a solvent of ink including metal oxide particles (hereinafter referred to as nano-particles). The technique (B) sinters metal nano-particle ink under a reduction environment before performing a high-temperature sintering in atmospheric air. The technique (C) sinters metal oxide nano-particles at a high temperatures. The technique (D) sinters organic metal complex or the like at a high temperature. An upper limit (preferably 130° C. or lower) of the process temperature to secure the required characteristics of the anode 5 in this embodiment may be satisfied when forming the layer that includes the metal oxide using the technique (A) described above.

Figure 2A:
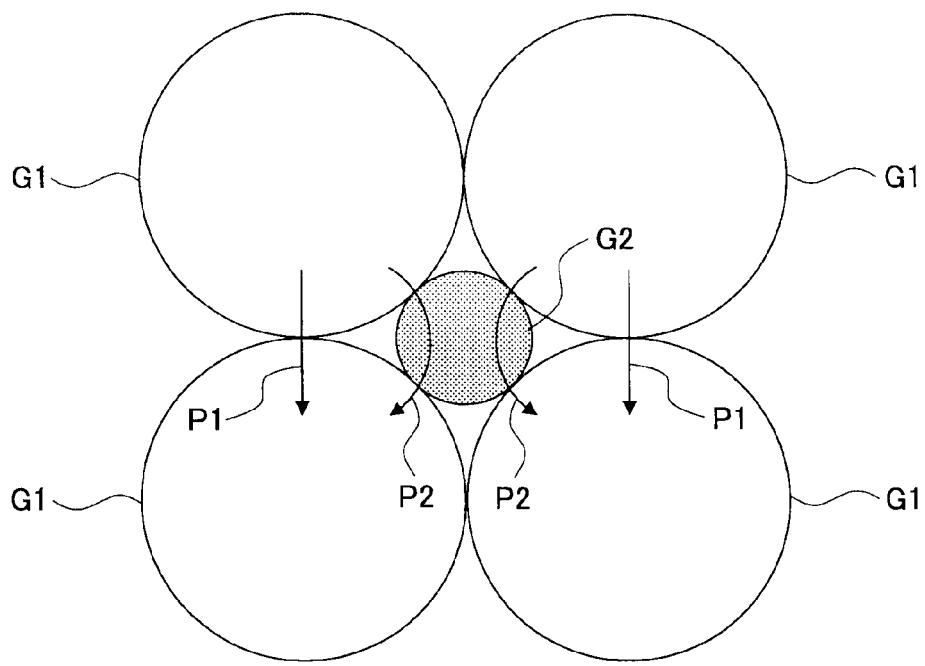
FIGS. 2A and 2B are diagrams for explaining a state in which metal oxide nano-particles of an anode make contact with one another.
Figure 2B:
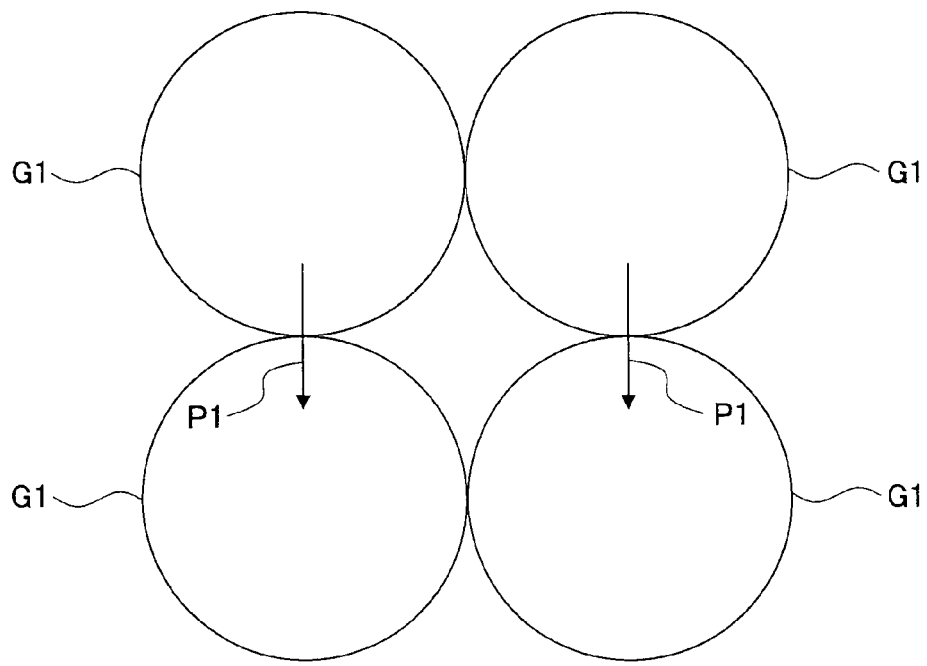

Next, a description will be given of the top emission type organic EL device 10 having the inverted stacked structure of this embodiment, in which the anode 5 has a high conductivity, by referring to FIGS. 2A and 2B. FIGS. 2A and 2B are diagrams for explaining a state in which metal oxide nano-particles of the anode 5 make contact with one another. FIG. 2A illustrates a state in which a gap between metal oxide nano-particles G1 is filled by a conductive polymer (or conductive macromolecule) G2. FIG. 2B illustrates a state in which the gap between the metal oxide nano-particles G1 is not filled by the conductive polymer G2.

The conductivity of the layer including the metal oxide nano-particles formed by the printing is lower by 2 digits to 5 digits when compared to the conductivity of the metal oxide layer formed by vacuum deposition. It may be regarded that the reason for the low conductivity of the layer including the metal oxide nano-particles is the gap formed between the metal oxide nano-particles G1 as illustrated in FIG. 2B, which reduces the density of the anode 5. Alternatively, it may be regarded that the reason for the low conductivity of the layer including the metal oxide nano-particles is the point-contact of the metal oxide nano-particles G1 that reduces a cross sectional area of a current path P1 for the current indicated by an arrow, and introduces a high contact resistance between the metal oxide nano-particles G1.

On the other hand, the conductivity of the layer including the conductive polymer and formed by the printing may be 0.001 S/cm to several 100 S/cm, for example, and may even exceed 1000 S/cm. The conductivity exceeding 1000 S/cm is approximately the same as the conductivity of the ITO layer formed by vacuum deposition.

The conductive polymer absorbs the light in the visible light region. For example, polythiophene or derivatives thereof may have a dark blue color, polyaniline or derivatives thereof may have a dark green color, and polypyrrole or derivatives thereof may have a dark brown color. The sheet resistance of the layer including the conductive polymer may be reduced by increasing the thickness of the layer, however, the transmittance may deteriorate by increasing the thickness of the layer.

There is an advantage in selecting the optimum material for the metal oxide and selecting the optimum particle diameter of the nano-particles thereof, in that a high transmittance may be realized in the visible light region.

In this embodiment, the anode 5 is formed by printing the functional liquid that is a mixture of the functional liquid including the metal oxide and the functional liquid including the conductive polymer. Hence, as illustrated in FIG. 2A, the gap between the metal oxide nano-particles G1 is filled by the conductive polymer G2 in the anode 5 of this embodiment. Consequently, the current path of the current flowing from one metal oxide nano-particle G1 to another metal oxide nano-particle G1 not only includes the current path P1 indicated by the arrow between two metal oxide nano-particles G1 making the point-contact, but also a current path P2 indicated by an arrow between the two metal oxide nano-particles G1 through the conductive polymer G2. In other words, the current path P1 passes through the point where the two metal oxide nano-particles G1 make the point-contact, and the current path P2 passes through the conductive polymer G2. Hence, the contact resistance between the metal oxide nano-particles G1 may be reduced, to thereby provide the anode 5 having a high conductivity and a high transmittance. As a result, a high light extraction efficiency may be realized in the top emission type organic EL device 10 having the inverted stacked structure.

A primary component of the metal oxide forming the metal oxide nano-particles may preferably include at least one element selected from zinc, indium, tin, and gallium. In other words, the metal oxide nano-particles may be formed by transparent conductive metal oxide nano-particles having at least one of indium oxide, tin oxide, and zinc oxide as a primary component. Examples of the transparent conductive metal oxide nano-particles include ITO (Indium Tin Oxide) nano-particles, IZO (Indium Zinc Oxide) nano-particles, IWO (Indium Tungsten Oxide) nano-particles, ITiO (Indium Titanium Oxide) nano-particles, indium zirconium oxide nano-particles, ATO (Antimony Tin Oxide) nano-particles, FTO (Fluorine Tine Oxide) nano-particles, AZO (Aluminum Zinc Oxide) nano-particles, GZO (Gallium Zinc Oxide) nano-particles, β-gallium oxide nano-particles, and the like. The metal oxide nano-particles are of course not limited to such materials, and other suitable materials may be used as long as a high transmittance is obtained in the visible light region and a high conductivity is obtained. For example, ITO nano-particles are suited for use as the metal oxide nano-particles because a high transmittance may be obtained in the visible light region and a high conductivity may be obtained.

An average primary particle diameter of the metal oxide nano-particles may preferably be 1 nm to 500 nm. It is difficult to form metal oxide nano-particles having an average primary particle diameter less than 1 nm. In addition, it may be difficult to obtain a high conductivity if the average primary particle diameter of the metal oxide nano-particles is less than 1 nm. On the other hand, if the average primary particle diameter of the metal oxide nano-particles exceeds 500 nm, it may be difficult to stably disperse the metal oxide nano-particles in liquid. Moreover, although the metal oxide nano-particles having the spherical or granular shape may generally be used, it is of course possible to use metal oxide nano-particles having a fiber shape (for example, needle shape, columnar shape, whisker shape, etc.), a parallelepiped shape (for example, cube shape, plate shape, etc.), and the like.

For example, polythiophene or derivatives thereof, polyaniline or derivatives thereof, and polypyrrole or derivatives thereof may be used for the conductive polymer. Polythiophene or derivatives thereof, and polyaniline or derivatives thereof are suited for use as the conductive polymer because these materials have a high transmittance in the visible light region and a high conductivity.

The conductive polymer may include a dopant. For example, the dopant may include organic sulfonic acid such as polystyrene sulfonate, organic trifluoroacetic acid, organic propionic acid, halogen such as iodine and bromine, and Lewis acids such as $PF_5$, $ASF_5$ and $SbF_5$. In addition, the conductive polymer may be a self-doping type in which the dopant directly bonds to the polymer compound.

The functional liquid including the metal oxide preferably includes the metal oxide nano-particles dissolved or dispersed in a solvent. In addition, the functional liquid including the conductive polymer preferably includes the conductive polymer dissolved or dispersed in a solvent.

The solvent of the functional liquid including the metal oxide may be formed by any suitable solvent that stably disperses the metal oxide nano-particles. In addition, the solvent of the functional liquid including the conductive polymer may be formed by any suitable solvent that stably dissolves or disperses the conductive polymer. For example, the solvent used in the functional liquid including the metal oxide and the solvent used in the functional liquid including the conductive polymer may include toluene, xylene, mesitylene, tetralin, decalin, bicyclohexyl, hydrocarbon solvents such as n-butylbenzene, s-butylbenzene and t-butylbenzene, halogenated hydrocarbon solvents such as carbon tetrachloride, chloroform, dichloromethane, dichloroethane, chlorobutane, bromobutane, chloropentane, bromopentane, chlorohexane, bromohexane, chlorocyclohexane and bromocyclohexane, halogenated unsaturated hydrocarbon solvents such as chlorobenzene, dichlorobenzene, trichlorobenzene, ether solvents such as tetrahydrofuran, tetrahydropyran and dioxane, glycol solvents such as ethylene glycol and trimethylene glycol, ketone solvents such as acetone, methyl ethyl ketone, diethyl ketone, acetylacetone and isophorone, ester solvents such as ethylacetate, butylacetate and benzylacetate, ether alcohol solvents such as methoxyethanol and ethoxyethanol, amide solvents such as N,N-dimethylformamide and N,N-dimethylacetamide, alcohol solvents such as methanol, ethanol, isopropanol, butanol, ethylene glycol, propylene glycol, butoxyethanol and methoxbutanol, and water.

In addition, the functional liquid may include two or more kinds of solvents which may be selected from the solvents described above. The solvent may preferably be selected in order to prevent easy redissolving or redispersion of the layer underneath the layer that is being formed using the functional liquid that includes the solvent.

A binder may be mixed to the functional liquid. For example, the binder may include inorganic binders such as alkylsilicate and alkyltitanate, and organic binders such as acrylic, alkyd, polyester, urethane and epoxy. The binder may preferably be a setting (or curing) type, such as the room temperature setting type, the thermosetting or bake-setting type, and the UV-ray (Ultra-Violet-ray) setting type. The content or quantity of the binder component may be set depending on the required binder performance.

The top emission type organic EL device 10 having the inverted stacked structure and using the polymer light emitting material may obtain the following advantageous features when compared to the organic EL device using the ITO layer as the anode.

That is, according to the organic EL device 10 of this embodiment, the anode 5 that is formed by the printing includes the metal oxide such as ITO, and the conductive polymer. For this reason, compared to the organic EL device having the anode formed by sputtering the ITO layer, the damage to the organic layer including the organic light emitting layer may be prevented, although such damage would be generated by plasma or radiant heat when the ITO layer is sputtered.

In addition, according to the organic EL device 10 of this embodiment, the anode 5 includes the metal oxide such as ITO, and the conductive polymer. Hence, compared to the organic EL device in which the anode only includes ITO nano-particles, the anode 5 has a high conductivity.

Furthermore, according to the organic EL device 10 of this embodiment, the functional liquid in which the composition ratio of the metal nano-particles, such as ITO, and the conductive polymer, are varied, may be adjusted in order to adjust the work function of the anode 5. Conventionally, the work function of the anode was not easily adjustable, and the material and the thickness of the organic layer including the organic light emitting layer were restricted by the work function of the anode. However, in this embodiment, the composition ratio of the metal nano-particles and the conductive polymer may be varied, in order to adjust the work function of the anode 5 depending on the work function of the organic layer including the organic light emitting layer. Hence, the difference between the work function of the anode and the work function of the organic layer including the organic light emitting layer may be made small, the height of the hole injection barrier may be reduced, the driving voltage of the organic EL device may be reduced, and the luminous efficacy may be improved.

Figure 3:
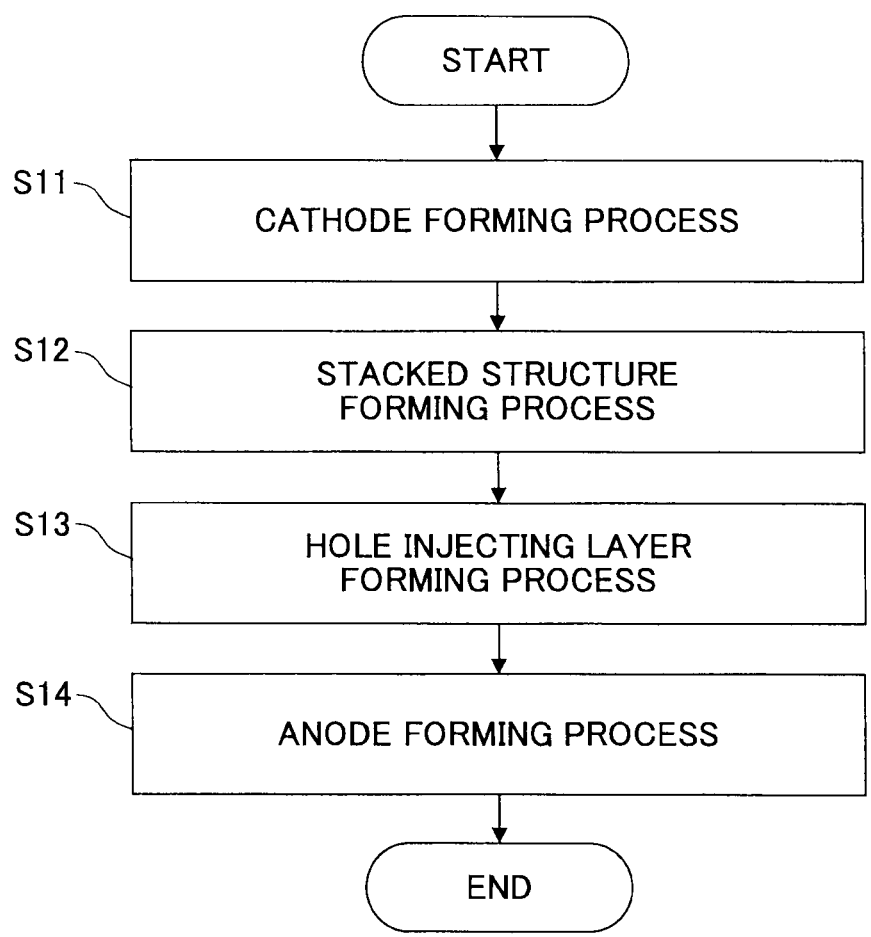
FIG. 3 is a flow chart for explaining procedures of an example of a method of fabricating the organic EL device in the first embodiment.

Next, a description will be given of a method of fabricating the organic EL device in this embodiment of the present invention, by referring to FIG. 3. FIG. 3 is a flow chart for explaining procedures of an example of the method of fabricating the organic EL device in the first embodiment.

The method of fabricating the organic EL device of this embodiment includes a step S11 to carry out a cathode forming process, a step S12 to carry out a stacked structure forming process, a step S13 to carry out a hole injecting layer forming process, and a step S14 to carry out an anode forming process.

The cathode forming process of the step S11 forms the cathode 2 on the substrate 1 by vacuum deposition, sputtering, ion plating, laminating that performs compression bonding of a metal thin film, and the like, as described above. The cathode 2 is made of an alkaline metal, alkaline earth metal, transition metal, group 13 (or boron group) metal, and the like.

The stacked structure forming process of the step S12 forms the stacked structure 3 in which the organic layer including the organic light emitting layer is stacked on the cathode 2, using a printing technique or vacuum deposition. The printing technique includes gravure printing, screen printing, flexography printing, offset printing, reverse printing, inkjet printing, and the like.

The hole injecting layer forming process of the step S13 forms the hole injecting layer 4 on the stacked structure 3, using a printing technique or vacuum deposition. The printing technique includes gravure printing, screen printing, flexography printing, offset printing, reverse printing, inkjet printing, and the like.

The cathode forming process of the step S14 forms the anode 5 on the stacked structure 3 having the hole injecting layer 4 formed thereon, by printing. The anode 5 is transparent and includes a metal oxide and conductive polymer. The printing technique includes gravure printing, screen printing, flexography printing, offset printing, reverse printing, inkjet printing, and the like.

The stacked structure forming process of the step S12 may form the stacked structure 3 by printing, and the hole injecting layer forming process of the step S13 may form the hole injecting layer 4 by printing. In this case, the layers 3 through 5 above the cathode 2 are formed by printing.

Alternatively, the cathode forming process of the step S11 may form the cathode 2 by printing. The cathode 2 may be printed using a functional liquid including a conductive polymer material, such as polyaniline or derivatives thereof and polythiophene or derivatives thereof, a liquid including a metal, such as nano-particle ink, paste and the like, a fusible metal in a melted state, and the like.

When all of the layers 2 through 5 on the substrate 1 are formed by printing, it may be necessary to select an appropriate solvent from the solvents described above, so that the layers underneath would not redissolve or redisperse when one of the processes of the steps S12 through S14 is carried out. In addition, in the process of forming the layer underneath (hereinafter also referred to as an underlayer), a binder may be added to the functional liquid that is used to form the underlayer in order to cause room temperature setting, thermosetting or bake-setting, UV-ray (Ultra-Violet-ray) setting or the like to cure the underlayer. Further, the material itself forming the underlayer may include a function group that causes the room temperature setting, thermosetting or bake-setting, UV-ray (Ultra-Violet-ray) setting or the like to cure the underlayer.

In this embodiment, the anode 5 is formed by a mixture of the metal oxide and the conductive polymer. However, the anode 5 may be made of any suitable material that is transparent and includes a metal oxide and a conductive polymer. For example, the metal oxide and the conductive polymer may not be mixed inside the anode 5, and the metal oxide and the conductive polymer may respectively exist in an aggregated state.

First Modification of First Embodiment

Figure 4:
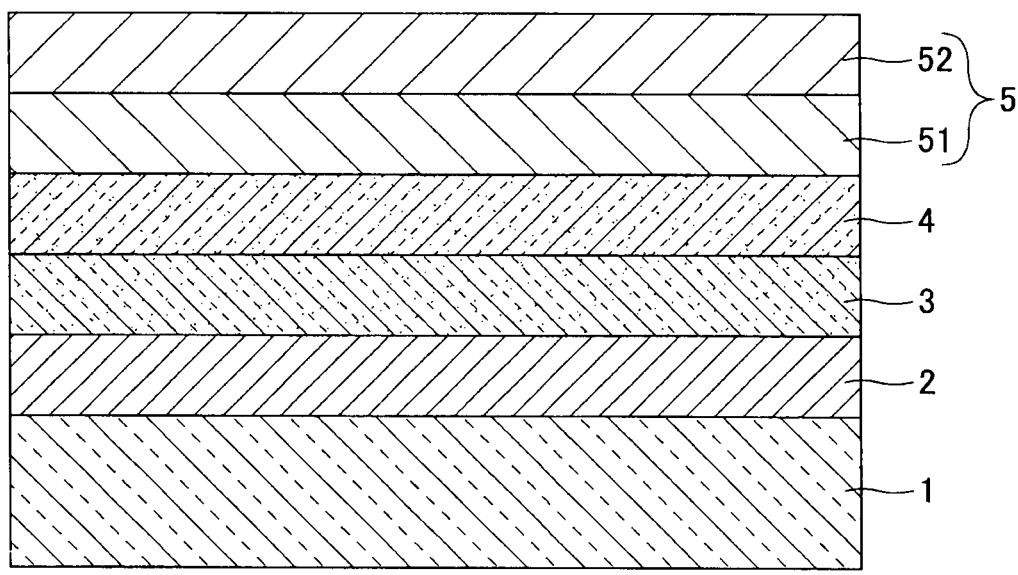
FIG. 4 is a cross sectional view illustrating a structure of an example of the organic EL device in a first modification of the first embodiment.

Next, a description will be given of a first modification of the first embodiment of the present invention, by referring to FIGS. 4 and 5. FIG. 4 is a cross sectional view illustrating a structure of an example of the organic EL device in a first modification of the first embodiment. In FIG. 4, those parts that are the same as those corresponding parts in FIG. 1 are designated by the same reference numerals, and a description thereof will be omitted.

As illustrated in FIG. 4, a cathode 2, a stacked structure 3, a hole injecting layer 4, and an anode 5 are successively formed on a substrate 1 to form an organic EL device 10a. In this first modification, the anode 5 of the organic EL device 10a has a stacked structure formed by a layer 51 that includes a conductive polymer, and a layer 52 that includes a metal oxide.

In this modification, the layer 51 including the conductive polymer is formed by printing, and the layer 52 including the metal oxide is formed on the layer 51 by printing, in order to form the anode 5. The layer 51 may be formed by printing a functional liquid in which the conductive polymer is dissolved or dispersed within a solvent. The layer 52 may be formed by printing a functional liquid in which the metal oxide is dispersed within a solvent. The surface resistance of the anode 5 is compensated by the layer 52 that includes the metal oxide with a high transmittance, in order to provide the anode 5 having a high conductivity and a high transmittance. Hence, a high light extraction efficiency may be realized in the top emission type organic EL device 10a having the inverted stacked structure.

In addition, in a vicinity of the interface between the layer 51 and the layer 52, the gap between the metal oxide nano-particles G1 may be filled by the conductive polymer G2, as illustrated in FIG. 2A. In this case, a high conductivity is achieved in the portion where the gap between the metal oxide nano-particles G1 is filled by the conductive polymer G2, because this portion includes the current path P2 in which the current flows through the conductive polymer G2.

Moreover, when forming the layer 52 by the printing, a portion of the layer 51 or, all of the layer 51, may be redissolved or redispersed. In this case, the gap between the metal oxide nano-particles G1 may be filled by the conductive polymer G2, as illustrated in FIG. 2A, throughout the entire anode 5 including the layers 51 and 52. In this case, a high conductivity may be achieved throughout the entire anode 5.

The conductive polymer material may be the same as that used in the first embodiment. In addition, the solvent and a binder of the functional liquid used to form the layer 51 may be the same as the solvent and the binder of the functional liquid used to form the anode 5 in the first embodiment.

The material, the average primary diameter, and the shape of the metal oxide nano-particles may be the same as those of the first embodiment. In addition, the solvent and a binder of the functional liquid used to form the layer 52 may be the same as the solvent and the binder of the functional liquid used to form the anode 5 in the first embodiment.

Figure 5:
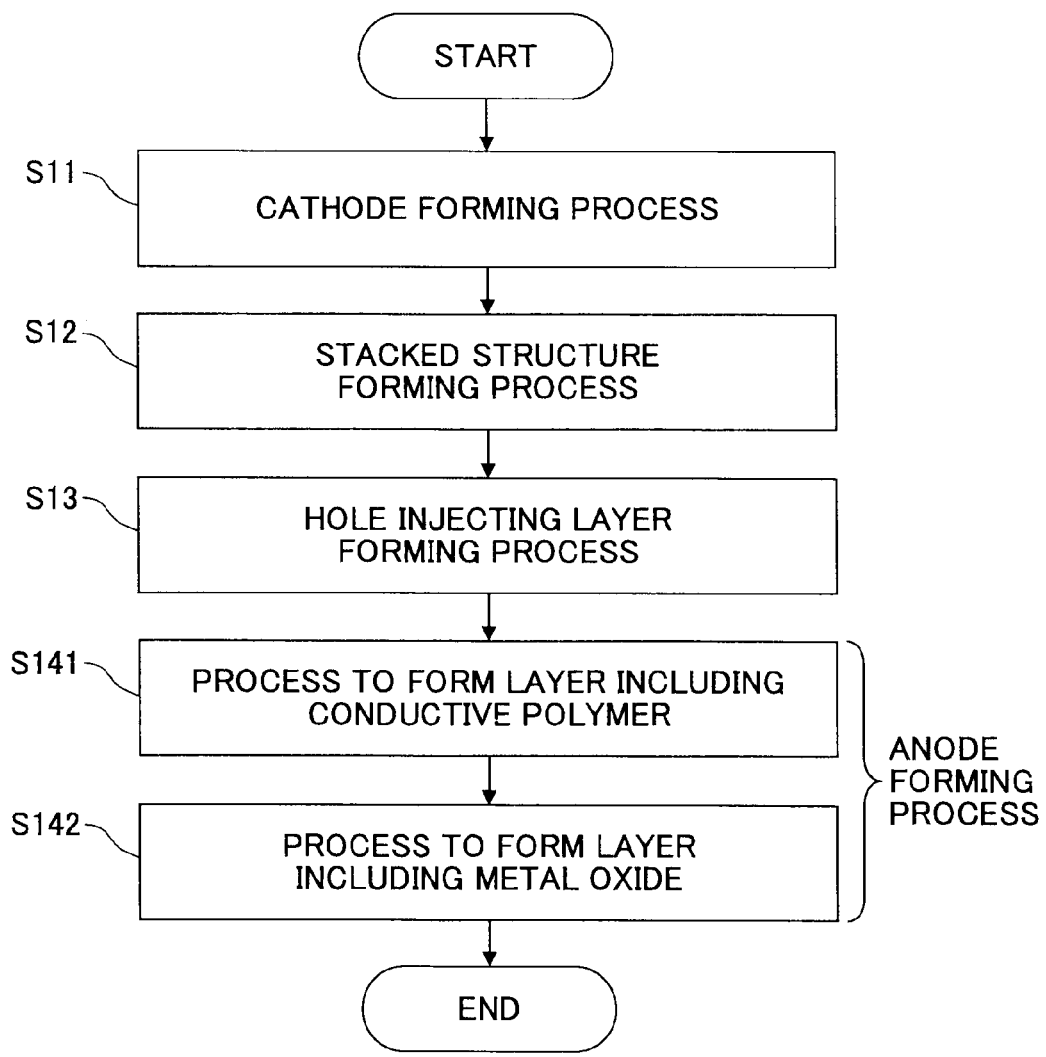
FIG. 5 is a flow chart for explaining the procedures of an example of the method of fabricating the organic EL device in the first modification of the first embodiment.

FIG. 5 is a flow chart for explaining the procedures of an example of the method of fabricating the organic EL device in the first modification of the first embodiment. In FIG. 5, those steps that are the same as those corresponding steps in FIG. 3 are designated by the same reference numerals, and a description thereof will be omitted.

The method of fabricating the organic EL device of this modification includes a step S11 to carry out a cathode forming process, a step S12 to carry out a stacked structure forming process, a step S13 to carry out a hole injecting layer forming process, and steps S141 and S142 to carry out an anode forming process. The step S141 carries out a process to form the layer 51 including the conductive polymer, and the step S142 carries out a process to form the layer 52 including the metal oxide.

The steps S11 through S13 are the same as the steps S11 through S13 of the first embodiment. The step S141 may form the layer 51 including the conductive polymer using a printing technique. The printing technique includes gravure printing, screen printing, flexography printing, offset printing, reverse printing, inkjet printing, and the like.

The step S142 may form the layer 52 including the metal oxide using a printing technique. The printing technique includes gravure printing, screen printing, flexography printing, offset printing, reverse printing, inkjet printing, and the like.

Second Modification of First Embodiment

Figure 6:
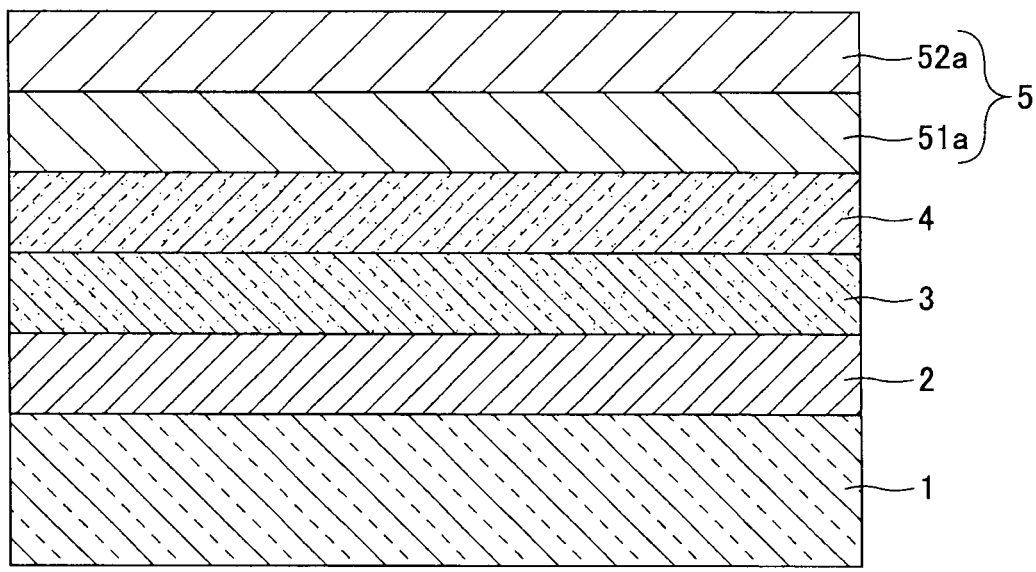
FIG. 6 is a cross sectional view illustrating a structure of an example of the organic EL device in a second modification of the first embodiment.

Next, a description will be given of a second modification of the first embodiment of the present invention, by referring to FIGS. 6 and 7. FIG. 6 is a cross sectional view illustrating a structure of an example of the organic EL device in a second modification of the first embodiment. In FIG. 6, those parts that are the same as those corresponding parts in FIG. 1 are designated by the same reference numerals, and a description thereof will be omitted.

As illustrated in FIG. 6, a cathode 2, a stacked structure 3, a hole injecting layer 4, and an anode 5 are successively formed on a substrate 1 to form an organic EL device 10b. In this second modification, the anode 5 of the organic EL device 10b has a stacked structure formed by a layer 51a that includes a metal oxide, and a layer 52a that includes a conductive polymer.

In this modification, the layer 51a including the metal oxide is formed by printing, and the layer 52a including the conductive polymer is formed on the layer 51a by printing, in order to form the anode 5. The layer 51a may be formed by printing a functional liquid in which the metal oxide is dispersed within a solvent. The layer 52a may be formed by printing a functional liquid in which the conductive polymer is dissolved or dispersed within a solvent. In this state, the gap between the metal oxide nano-particles G1 is filled by the conductive polymer G2, as illustrated in FIG. 2A. Consequently, the current path of the current flowing from one metal oxide nano-particle G1 to another metal oxide nano-particle G1 not only includes the current path P1 indicated by the arrow between two metal oxide nano-particles G1 making the point-contact, but also the current path P2 indicated by the arrow between the two metal oxide nano-particles G1 through the conductive polymer G2. In other words, the current path P1 passes through the point where the two metal oxide nano-particles G1 make the point-contact, and the current path P2 passes through the conductive polymer G2. Hence, the contact resistance between the metal oxide nano-particles G1 may be reduced, to thereby provide the anode 5 having a high conductivity and a high transmittance. As a result, a high light extraction efficiency may be realized in the top emission type organic EL device 10b having the inverted stacked structure.

In addition, in the layer 52a in a vicinity of the interface between the layer 51a and the layer 52a, the gap between the metal oxide nano-particles G1 may be filled by the conductive polymer G2, as illustrated in FIG. 2A. In this case, a high conductivity is achieved in the portion where the gap between the metal oxide nano-particles G1 is filled by the conductive polymer G2, because this portion includes the current path P2 in which the current flows through the conductive polymer G2.

Moreover, when forming the layer 52a by the printing, a portion of the layer 51a or, all of the layer 51a, may be redissolved or redispersed. In this case, the gap between the metal oxide nano-particles G1 may be filled by the conductive polymer G2, as illustrated in FIG. 2A, throughout the entire anode 5 including the layers 51a and 52a. In this case, a high conductivity may be achieved throughout the entire anode 5.

The solvent and a binder of the functional liquid used to form the layer 51a may be the same as the solvent and the binder of the functional liquid used to form the layer 52 in the first modification of the first embodiment.

The solvent and a binder of the functional liquid used to form the layer 52a may be the same as the solvent and the binder of the functional liquid used to form the layer 51 in the first modification of the first embodiment.

Figure 7:
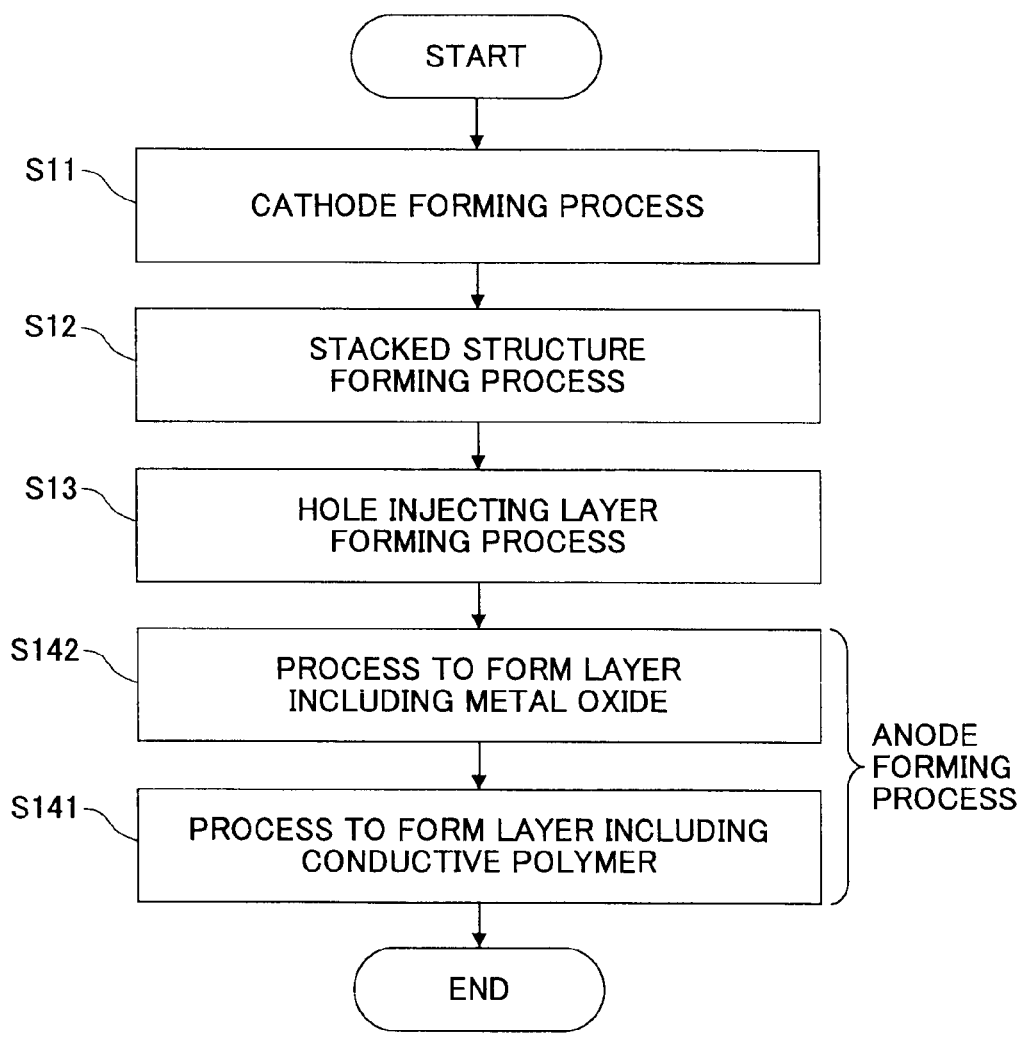
FIG. 7 is a flow chart for explaining the procedures of an example of the method of fabricating the organic EL device in the second modification of the first embodiment.

FIG. 7 is a flow chart for explaining the procedures of an example of the method of fabricating the organic EL device in the second modification of the first embodiment. In FIG. 7, those steps that are the same as those corresponding steps in FIG. 5 are designated by the same reference numerals, and a description thereof will be omitted.

The method of fabricating the organic EL device of this modification includes a step S11 to carry out a cathode forming process, a step S12 to carry out a stacked structure forming process, a step S13 to carry out a hole injecting layer forming process, and steps S142 and S141 to carry out an anode forming process. The step S142 carries out a process to form the layer 51a including the metal oxide, and the step S141 carries out a process to form the layer 52a including the conductive polymer. The order of the steps S142 and S141 is reversed from that in the first modification of the first embodiment, but the processes of the steps S142 and S141 are the same as those of the corresponding steps S142 and S141 in the first modification of the first embodiment.

Second Embodiment

Figure 8:
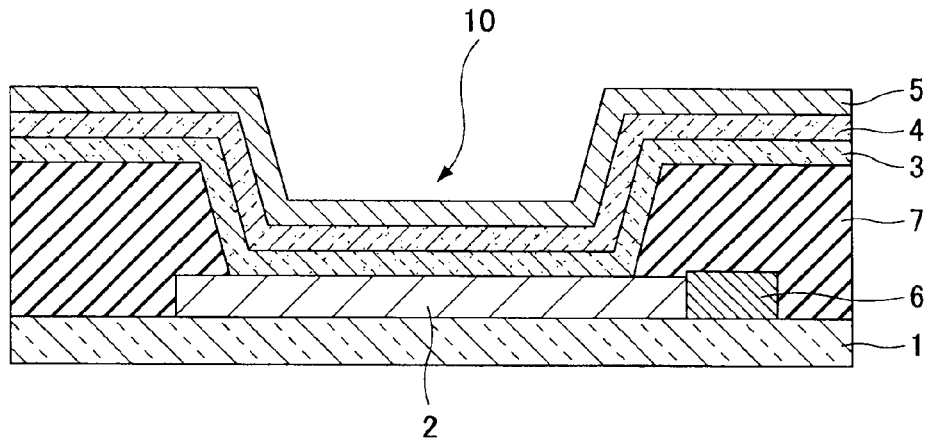
FIG. 8 is a cross sectional view illustrating a structure of an example of a surface emitting light source or an illumination device in a second embodiment of the present invention.

Next, a description will be given of a surface emitting light source or an illumination device in a second embodiment of the present invention, by referring to FIG. 8. FIG. 8 is a cross sectional view illustrating a structure of an example of the surface emitting light source or the illumination device in the second embodiment of the present invention. In FIG. 8, those parts that are the same as those corresponding parts in FIG. 1 are designated by the same reference numerals, and a description thereof will be omitted.

The organic EL device in any of the first embodiment and the first and second modifications thereof may be suited for use in curved or planar light sources, illumination devices, and surface emitting light sources that may be used as a light source of a scanner, for example. Hence, the surface emitting light source or illumination device in this second embodiment is provided with the organic EL device according to any of the first embodiment and the first and second modifications thereof. The surface emitting light source or illumination device illustrated in FIG. 8 is provided with the organic EL device 10 according to the first embodiment. A surface emitting light source or illumination device 20 illustrated in FIG. 8 forms a light emission apparatus in accordance with one embodiment of the present invention.

As illustrated in FIG. 8, the surface emitting light source or illumination device 20 includes a pixel 10 that is formed by the organic EL device 10. The pixel 10 includes a cathode 2, a stacked structure 3, a hole injecting layer 4, and an anode 5 that are successively provided on a substrate 1. The anode 2 is electrically connected to a wiring (or interconnection) 6. A pixel separation layer 7 having an opening in a region corresponding to the pixel 10 is provided on the substrate 1, and the pixel 10 is arranged in the opening of the pixel separation layer 7. The surface emitting light source of illumination device 20 may include a plurality of pixels 10 that are formed by the organic EL devices 10.

The thickness of the pixel separation layer 7 may preferably be 0.1 μm to 5 μm. The pixel separation layer 7 may preferably be made of a material that is less likely to undergo changes due to heat, such as an organic material having a relatively high heat resistance. For example, photosensitive polyimide may be used for the pixel separation layer 7. Materials other than polyimide that may be used for the pixel separation layer 7 include acrylic (or methacrylic) or novolak resin materials. These resin materials may be photosensitive in order to facilitate patterning thereof.

When fabricating the surface emitting light source or illumination device 20, a metal layer made of Al or the like is deposited on the substrate 1, and the metal layer is patterned in order to form the cathode 2 and the wiring 6. For example, a photosensitive polyimide layer is printed on the substrate 1 having the cathode 2 and the wiring 6 formed thereon. A pattern is exposed on the photosensitive polyimide layer, and a portion above the cathode 2 is dissolved and removed in order to form the pixel separation layer 7 having the opening above the cathode 2. The stacked structure 3, the hole injecting layer 4, and the anode 5 are successively formed on the substrate 1 having the pixel separation layer 7 formed thereon and having the opening of the pixel separation layer 7 arranged above the cathode 2. As a result, the surface emitting light source or illumination device 20 illustrated in FIG. 8 is fabricated.

The surface emitting light source or illumination device 20 in this embodiment is provided with the organic EL device according to any of the first embodiment and the first and second modifications thereof. For this reason, the anode 5 may have a high conductivity and a high transmittance, and a high light extraction efficiency may be realized in the top emission type organic EL device having the inverted stacked structure.

Third Embodiment

Figure 9:
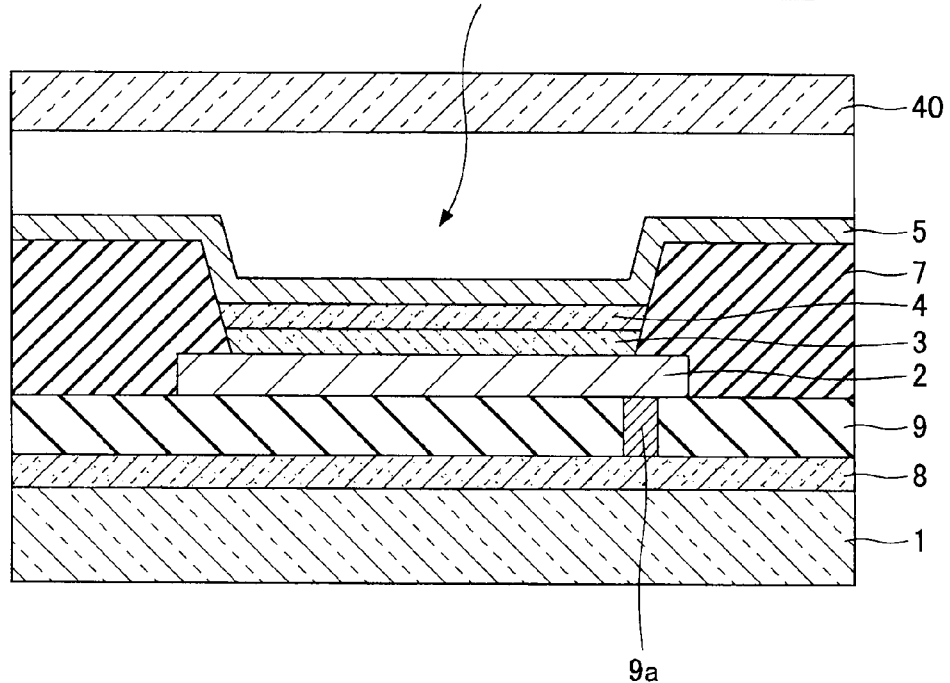
FIG. 9 is a cross sectional view illustrating a structure of an example of a display device in a third embodiment of the present invention.

Next, a description will be given of a display device in a third embodiment of the present invention, by referring to FIG. 9. FIG. 9 is a cross sectional view illustrating a structure of an example of the display device in the third embodiment of the present invention. In FIG. 9, those parts that are the same as those corresponding parts in FIG. 1 are designated by the same reference numerals, and a description thereof will be omitted.

The organic EL device in any of the first embodiment and the first and second modifications thereof may be suited for use in a display device. Hence, the display device in this third embodiment is provided with the organic EL device according to any of the first embodiment and the first and second modifications thereof. The display device may be formed by a segment display device, a dot matrix display device, or the like. The dot matrix display device may be categorized into an active matrix display device and a passive matrix display device.

In this embodiment, the organic EL device according to any of the first embodiment and the first and second modifications thereof may form a light emitting element (or device) that forms each pixel in the active matrix display device illustrated in FIG. 9, for example. Alternatively, the organic EL device according to any of the first embodiment and the first and second modifications thereof may form a light emitting element (or device) that forms each segment in the segment display device or, may form a back light of a liquid crystal display device.

The display device illustrated in FIG. 9 is provided with the organic EL device 10 according to the first embodiment. A display device 30 illustrated in FIG. 9 forms a light emission apparatus in accordance with one embodiment of the present invention.

As illustrated in FIG. 9, the display device 30 includes a pixel 10 that is formed by the organic EL device 10. The pixel 10 includes a cathode 2, a stacked structure 3, a hole injecting layer 4, and an anode 5 that are successively provided on a substrate 1. A pixel separation layer 7 having an opening in a region corresponding to the pixel 10 is provided on the substrate 1, and the pixel 10 is arranged in the opening of the pixel separation layer 7. The thickness and the material used for the pixel separation layer 7 may be the same as those of the second embodiment described above. In addition, the stacked structure 3 and the hole injecting layer 4 may only be provided in the opening of the pixel separation layer 7. The display device 30 may include a plurality of pixels 10 that are formed by the organic EL devices 10.

Furthermore, a TFT circuit 8 and a planarization layer 9 are successively formed on the substrate 1. The cathode 2 and the pixel separation layer 7 are formed on the planarization layer 9. The cathode 2 electrically connects to the TFT circuit 8 through a penetration electrode 9a that is formed to penetrate the planarization layer 9.

When fabricating the display device 30, the TFT circuit 8 is formed in a matrix arrangement on the substrate 1. The planarization layer 9 may be made of silicon dioxide, for example, and is formed on the substrate 1 that is formed with the TFT circuit 8. The penetration electrode 9a is formed to penetrate the planarization layer 9 and to electrically connect the cathode 2 that is formed thereafter to the TFT circuit 8. A metal layer made of Al or the like is deposited on the planarization layer 9 that is formed with the penetration electrode 9a, and the metal layer is patterned in order to form the cathode 2. Thereafter, the pixel separation layer 7, the stacked structure 3, the hole injecting layer 4, and the anode 5 are successively formed in the same manner as the second embodiment described above. The stacked structure 3 and the hole injecting layer 4 may only be formed in the opening of the pixel separation layer 7 using the inkjet printing, for example. An encapsulating substrate 40 made of a glass substrate, for example, is bonded on the anode 5 using an adhesive such as an epoxy resin, in order to form the display device 30. The adhesive may be provided along an outer edge of the display device 30, for example. Hence, a gap between the anode 5 and the encapsulating substrate 40 illustrated in FIG. 9 may be determined by a thickness of the adhesive provided along the outer edge of the display device 30.

The display device 30 in this embodiment is provided with the organic EL device according to any of the first embodiment and the first and second modifications thereof. For this reason, the anode 5 may have a high conductivity and a high transmittance, and a high light extraction efficiency may be realized in the top emission type organic EL device having the inverted stacked structure.

EXAMPLES

Next, a description will be given of example embodiments and comparison examples. The present invention is not, of course, limited in any way by these examples.

Example Embodiment Emb1

The organic EL device 10 illustrated in FIG. 1 was fabricated in the following manner in an example embodiment (or embodiment sample) Emb1. First, a magnesium-silver alloy was deposited on the substrate 1, and a layer of this alloy was patterned to form the cathode 2 having a thickness of 100 nm and an area of 4 mm$^2$. In this state in which the cathode 2 is not exposed to the atmosphere, 1 weight % of toluene solution of a poly(p-phenylene vinylene) organic light emitting material was spin-coated on the cathode 2, and thereafter baked at 130° C. for 10 minutes, in order to form the organic light emitting layer 3 having a thickness of 70 nm.

Next, a functional liquid was adjusted by adding 30 weight % of ethyleneglycol-monomethylether, and 10 weight % of a polymer solution including melamine derivative as the binder, to PEDOT/PSS (poly(3,4-ethylenedioxythiophene) poly(styrenesulfonate)) dispersion liquid (with a solid content concentration of 1.3 weight %). The adjusted functional liquid was spin-coated on the organic light emitting layer 3, and thereafter baked at 130° C. for 10 minutes, in order to form the hole injecting layer 4 having a thickness of 40 nm. No redissolving of the organic light emitting layer 3 underneath was observed by the formation of the hole injecting layer 4.

Then, a dispersion liquid (with a solid content concentration of 3 weight %) of a conductive polymer material including a polythiophene derivative, and an IPA (2-propanol) dispersion liquid (with a solid content concentration of 20 weight %) of ITO nano-particles having an average particle diameter of approximately 20 nm, were mixed at a volume ratio of 1:10, in order to adjust a functional liquid. The adjusted functional liquid was spin-coated on the hole injecting layer 4, and thereafter baked at 130° C. for 10 minutes, in order to form the anode 5 having a thickness of 400 nm.

When a voltage was applied between two electrodes of the organic EL device 10 that is fabricated in this manner, green light emission was observed from a top surface of the organic EL device 10.

Example Embodiment Emb2

The organic EL device 10a illustrated in FIG. 4 was fabricated in the following manner in an example embodiment (or embodiment sample) Emb2. First, a magnesium-silver alloy was deposited on the substrate 1, and a layer of this alloy was patterned to form the cathode 2 having a thickness of 100 nm and an area of 4 mm$^2$. In this state in which the cathode 2 is not exposed to the atmosphere, 1 weight % of toluene solution of a poly (p-phenylene vinylene) organic light emitting material was spin-coated on the cathode 2, and thereafter baked at 130° C. for 10 minutes, in order to form the organic light emitting layer 3 having a thickness of 70 nm.

Next, a functional liquid was adjusted by adding 30 weight % of ethyleneglycol-monomethylether, and 10 weight % of a polymer solution including melamine derivative as the binder, to PEDOT/PSS (poly(3,4-ethylenedioxythiophene) poly(styrenesulfonate)) dispersion liquid (with a solid content concentration of 1.3 weight %). The adjusted functional liquid was spin-coated on the organic light emitting layer 3, and thereafter baked at 130° C. for 10 minutes, in order to form the hole injecting layer 4 having a thickness of 40 nm. No redissolving of the organic light emitting layer 3 underneath was observed by the formation of the hole injecting layer 4.

Then, a dispersion liquid (with a solid content concentration of 3 weight %) of a conductive polymer material including a polythiophene derivative was spin-coated on the hole injecting layer 4, and thereafter baked at 120° C. for 10 minutes, in order to form the layer 51 having a thickness of 60 nm.

In addition, a functional liquid of an IPA (2-propanol) dispersion liquid (with a solid content concentration of 20 weight %) of ITO nano-particles having an average particle diameter of approximately 20 nm was adjusted and spin-coated on the layer 51, and thereafter baked at 120° C. for 10 minutes, in order to form the layer 52 having a thickness of 500 nm.

When a voltage was applied between two electrodes of the organic EL device 10a that is fabricated in this manner, green light emission was observed from a top surface of the organic EL device 10a.

Example Embodiment Emb3

The organic EL device 10b illustrated in FIG. 6 was fabricated in the following manner in an example embodiment (or embodiment sample) Emb3. First, a magnesium-silver alloy was deposited on the substrate 1, and a layer of this alloy was patterned to form the cathode 2 having a thickness of 100 nm and an area of 4 mm$^2$. In this state in which the cathode 2 is not exposed to the atmosphere, 1 weight % of toluene solution of a poly (p-phenylene vinylene) organic light emitting material was spin-coated on the cathode 2, and thereafter baked at 130° C. for 10 minutes, in order to form the organic light emitting layer 3 having a thickness of 70 nm.

Next, a functional liquid was adjusted by adding 30 weight % of ethyleneglycol-monomethylether, and 10 weight % of a polymer solution including melamine derivative as the binder, to PEDOT/PSS (poly(3,4-ethylenedioxythiophene) poly(styrenesulfonate)) dispersion liquid (with a solid content concentration of 1.3 weight %). The adjusted functional liquid was spin-coated on the organic light emitting layer 3, and thereafter baked at 130° C. for 10 minutes, in order to form the hole injecting layer 4 having a thickness of 40 nm. No redissolving of the organic light emitting layer 3 underneath was observed by the formation of the hole injecting layer 4.

Then, a functional liquid of an IPA (2-propanol) dispersion liquid (with a solid content concentration of 20 weight %) of ITO nano-particles having an average particle diameter of approximately 20 nm was adjusted and spin-coated on the hole injecting layer 4, and thereafter baked at 120° C. for 10 minutes, in order to form the layer 51*a* having a thickness of 500 nm.

In addition, a dispersion liquid (with a solid content concentration of 3 weight %) of a conductive polymer material including a polythiophene derivative was spin-coated on the layer 51*a*, and thereafter baked at 120° C. for 10 minutes, in order to form the layer 52*a* having a thickness of 60 nm.

When a voltage was applied between two electrodes of the organic EL device 10*b* that is fabricated in this manner, green light emission was observed from a top surface of the organic EL device 10*b*.

Example Embodiment Emb4

In an example embodiment (or embodiment sample) Emb4, the organic EL device 10 illustrated in FIG. 1 was fabricated in a manner similar to that of the example embodiment Emb1 described above, except that a polyaniline derivative was used in place of the polythiophene derivative when forming the anode 5 to a thickness of 400 nm.

When a voltage was applied between two electrodes of the organic EL device 10 that is fabricated in this manner, green light emission was observed from a top surface of the organic EL device 10.

Example Embodiment Emb5

In an example embodiment (or embodiment sample) Emb5, the organic EL device 10*a* illustrated in FIG. 4 was fabricated in a manner similar to that of the example embodiment Emb2 described above, except that a polyaniline derivative was used in place of the polythiophene derivative when forming the layer 51 to a thickness of 60 nm.

When a voltage was applied between two electrodes of the organic EL device 10*a* that is fabricated in this manner, green light emission was observed from a top surface of the organic EL device 10*a*.

Example Embodiment Emb6

In an example embodiment (or embodiment sample) Emb6, the organic EL device 10*b* illustrated in FIG. 6 was fabricated in a manner similar to that of the example embodiment Emb3 described above, except that a polyaniline derivative was used in place of the polythiophene derivative when forming the layer 52*a* to a thickness of 60 nm.

When a voltage was applied between two electrodes of the organic EL device 10*b* that is fabricated in this manner, green light emission was observed from a top surface of the organic EL device 10*b*.

Comparison Example Cmp1

In a comparison example Cmp1, an organic EL device similar to the organic EL device 10 illustrated in FIG. 1 but not including a metal oxide in the anode 5, was fabricated.

A cathode 2 having a thickness of 100 nm and an area of 4 mm$^2$, an organic light emitting layer 3 having a thickness of 70 nm, and a hole injecting layer 4 having a thickness of 40 nm were successively formed on a substrate 1. Thereafter, a dispersion liquid (with a solid content concentration of 3 weight %) of a conductive polymer material including a polythiophene derivative was spin-coated on the hole injecting layer 4, and thereafter baked at 120° C. for 10 minutes, in order to form the anode 5 having a thickness of 60 nm.

When a voltage was applied between two electrodes of the organic EL device that is fabricated in this manner, weak green light emission was observed from a top surface of the organic EL device.

Comparison Example Cmp2

In a comparison example Cmp2, the organic EL device was fabricated in a manner similar to that of the comparison example Cmp1 described above, except that a polyaniline derivative was used in place of the polythiophene derivative when forming the anode 5 to a thickness of 60 nm.

When a voltage was applied between two electrodes of the organic EL device that is fabricated in this manner, weak green light emission was observed from a top surface of the organic EL device.

Comparison Example Cmp3

In a comparison example Cmp3, an organic EL device similar to the organic EL device 10 illustrated in FIG. 1 but not including conductive polymer in the anode 5, was fabricated.

A cathode 2 having a thickness of 100 nm and an area of 4 mm$^2$, an organic light emitting layer 3 having a thickness of 70 nm, and a hole injecting layer 4 having a thickness of 40 nm were successively formed on a substrate 1. Thereafter, a functional liquid of an IPA (2-propanol) dispersion liquid (with a solid content concentration of 20 weight %) of ITO nano-particles having an average particle diameter of approximately 20 nm was spin-coated on the hole injecting layer 4, and thereafter baked at 120° C. for 10 minutes, in order to form the anode 5 having a thickness of 500 nm.

When a voltage was applied between two electrodes of the organic EL device that is fabricated in this manner, no light emission was observed from a top surface of the organic EL device.

Comparison Example Cmp4

In a comparison example Cmp4, an organic EL device similar to the organic EL device 10 illustrated in FIG. 1 but in which the anode 5 is formed by sputtering an ITO layer, was fabricated.

A cathode 2 having a thickness of 100 nm and an area of 4 mm², an organic light emitting layer 3 having a thickness of 70 nm, and a hole injecting layer 4 having a thickness of 40 nm were successively formed on a substrate 1. Thereafter, a sputtering apparatus was used to form an ITO layer to a thickness of 100 nm, in order to form the anode 5.

When a voltage was applied between two electrodes of the organic EL device that is fabricated in this manner, no light emission was observed from a top surface of the organic EL device.

The following Table 1 illustrates the relative luminance of the light emissions measured at a position opposing the light emitting surface of each of the organic EL devices in accordance with the example embodiments Emb1 through Emb6 and the comparison examples Cmp1 through Cmp4.

TABLE 1

| Example | Relative Luminance |
| --- | --- |
| Example Embodiment Emb1 | 110 |
| Example Embodiment Emb2 | 100 |
| Example Embodiment Emb3 | 104 |
| Example Embodiment Emb4 | 108 |
| Example Embodiment Emb5 | 98 |
| Example Embodiment Emb6 | 102 |
| Comparison Example Cmp1 | 18 |
| Comparison Example Cmp2 | 11 |
| Comparison Example Cmp3 | 0 |
| Comparison Example Cmp4 | 0 |

The light emissions were measured by flowing a current of 1 mA across two electrodes of each of the organic EL devices in accordance with the example embodiments Emb1 through Emb6 and the comparison examples Cmp1 through Cmp4, and each measured luminance was indicated in a relative value relative to the luminance measured for the example embodiment Emb2 by regarding the luminance value measured for the example embodiment Emb2 to be "100". The dimensions (or size) of the example embodiments Emb1 through Emb6 and the comparison examples Cmp1 through Cmp4 were set the same.

As may be seen from the Table 1, the relative luminance of the organic EL devices in accordance with the example embodiments Emb1 through Emb6 is approximately 5 or more times higher than the relative luminance of the organic EL devices in accordance with the comparison examples Cmp1 through Cmp4. In other words, a high light extraction efficiency may be realized in the organic EL devices in accordance with the example embodiments Emb1 through Emb6 when compared to the organic EL devices in accordance with the comparison examples Cmp1 through Cmp4. It may be regarded that the high light extraction efficiency is realized in the organic EL devices in accordance with the example embodiments Emb1 through Emb6 because of the high transmittance of the anode 5 in the visible light region and the high conductivity of the anode 5, when compared to the organic EL devices in accordance with the comparison examples Cmp1 through Cmp4. Accordingly, it was confirmed that the embodiments may provide an anode having a high transmittance and a high conductivity in the top emission type organic EL device having the inverted stacked structure.

Example Embodiment Emb7

In an example embodiment (or embodiment sample) Emb7, a functional liquid in which a composition ratio of an IPA (2-propanol) dispersion liquid (with a solid content concentration of 20 weight %) of ITO nano-particles having an average particle diameter of approximately 20 nm and a dispersion liquid (with a solid content concentration of 1 weight %) of a conductive polymer material including a polyaniline derivative, is varied, was adjusted. The adjusted functional liquid was spin-coated on the silicon substrate, and thereafter baked at 130° C. for 10 minutes, in order to form a spin-coated layer corresponding to the anode 5. A work function of the spin-coated layer was measured using a detector model AC-2 for photoemission yield spectroscopy in air manufactured by Riken Keiki Co., Ltd. of Japan.

The following Table 2 illustrates the measured work functions of the spin-coated layers for various composition ratios. In the Table 2, the composition ratio of 100% means that the spin-coated layer is formed solely of the IPA dispersion liquid of the ITO nano-particles, and the composition ratio of 0% means that the spin-coated layer is formed solely of the dispersion liquid of the conductive polymer material including the polyaniline derivative.

TABLE 2

| Composition Ratio (%) | Work Function (eV) |
| --- | --- |
| 100 | 4.50 |
| 80 | 4.66 |
| 60 | 4.76 |
| 40 | 4.94 |
| 20 | 5.03 |
| 0 | 5.07 |

As may be seen from the Table 2, the work function of the spin-coated layer varies uniformly as the mixture ratio varies. Hence, it was confirmed that the work function of the anode 5 may be adjusted by adjusting the functional liquid in which the composition ratio of the metal nano-particles and the conductive polymer is varied, as described above.

Example Embodiment Emb8

In an example embodiment (or embodiment sample) Emb8, the surface emitting light source or illumination device 20 illustrated in FIG. 8 was fabricated.

An Al layer was deposited on a substrate 1 and patterned to form a cathode 2 and a wiring 6 having a thickness of 100 nm. Then, a photosensitive polyimide was used to form a pixel separation layer 7 having a thickness of 1 μm and an opening with an area of 1000 mm².

Thereafter, 1 weight % of toluene solution of a poly (p-phenylene vinylene) organic light emitting material was spin-coated on the pixel separation layer 7, and thereafter baked at 130° C. for 10 minutes, in order to form an organic light emitting layer 3 having a thickness of 70 nm.

Next, a functional liquid was adjusted by adding 30 weight % of ethyleneglycol-monomethylether, and 10 weight % of a polymer solution including melamine derivative as the binder, to PEDOT/PSS (poly(3,4-ethylenedioxythiophene) poly(styrenesulfonate)) dispersion liquid (with a solid content concentration of 1.3 weight %). The adjusted functional liquid was spin-coated on the organic light emitting layer 3, and thereafter baked at 130° C. for 10 minutes, in order to form a hole injecting layer 4 having a thickness of 40 nm. No redissolving of the organic light emitting layer 3 underneath was observed by the formation of the hole injecting layer 4.

Then, a dispersion liquid (with a solid content concentration of 3 weight %) of a conductive polymer material including a polythiophene derivative, and an IPA (2-propanol) dispersion liquid (with a solid content concentration of 20 weight %) of ITO nano-particles having an average particle diameter of approximately 20 nm, were mixed at a volume ratio of 1:10, in order to adjust a functional liquid. The adjusted functional liquid was spin-coated on the hole injecting layer 4, and thereafter baked at 120° C. for 10 minutes, in order to form an anode 5 having a thickness of 400 nm.

When a voltage was applied between two electrodes of the surface emitting light source or illumination device 20 that is fabricated in this manner, light emission was observed from a top surface of the organic EL device.

Example Embodiment Emb9

In an example embodiment (or embodiment sample) Emb9, the display device 30 illustrated in FIG. 9 was fabricated.

A polysilicon type TFT circuit 8 including gate electrodes was formed in a matrix arrangement on a substrate 1. Then, a planarization layer 9 made of silicon dioxide ($SiO_2$) was formed on the substrate 1 that is formed with the TFT circuit 8. A penetration electrode 9a was formed to penetrate the planarization layer 9 and to electrically connect a cathode 2 that is formed thereafter to the TFT circuit 8. Further, an Al layer was deposited on the planarization layer 9 that is formed with the penetration electrode 9a, and the Al layer was patterned, in order to form the cathode 2 that electrically connects to the TFT circuit 8 through the penetration electrode 9a. The cathode 2 was formed to a thickness of 100 nm.

Next, a photosensitive polyimide was used to form a pixel separation layer 7 having an opening on the planarization layer 9 in a region between the pixels. The pixel separation layer 7 was formed to a thickness of 1 μm, and to have the opening with an area of 1000 $mm^2$.

Next, a mesitylene solution of a poly(p-phenylene vinylene) organic light emitting material was formed on the cathode 2 by inkjet printing, and thereafter baked at 130° C. for 10 minutes in a decompression environment of 1 Torr, in order to form an organic light emitting layer 3 having a thickness of 70 nm.

Then, a functional liquid was adjusted by adding 30 weight % of ethyleneglycol-monomethylether, and 10 weight % of a polymer solution including melamine derivative as the binder, to PEDOT/PSS (poly(3,4-ethylenedioxythiophene) poly(styrenesulfonate)) dispersion liquid (with a solid content concentration of 1.3 weight %). The adjusted functional liquid was formed on the organic light emitting layer 3 by inkjet printing, and thereafter baked at 130° C. for 10 minutes, in order to form a hole injecting layer 4 having a thickness of 40 nm.

In addition, a dispersion liquid (with a solid content concentration of 3 weight %) of a conductive polymer material including a polythiophene derivative, and an IPA (2-propanol) dispersion liquid (with a solid content concentration of 20 weight %) of ITO nano-particles having an average particle diameter of approximately 20 nm, were mixed at a volume ratio of 1:10, in order to adjust a functional liquid. The adjusted functional liquid was spin-coated on the hole injecting layer 4, and thereafter baked at 120° C. for 10 minutes, in order to form an anode 5 having a thickness of 400 nm.

Finally, an encapsulating substrate 40 made of a glass substrate was bonded on the anode 5 using an adhesive such as an epoxy resin, in order to form the display device 30.

When a voltage was applied between two electrodes of the display device 30 that is fabricated in this manner, light emission was observed from a top surface of the organic EL device.

In this specification, the consecutive numbers, such as "first" and "second", assigned to the embodiments and modifications thereof do not represent priorities of the embodiments and modifications.

Further, the present invention is not limited to these embodiments, but various variations and further modifications may be made without departing from the scope of the present invention.

This application is based on Japanese Patent Application No. 2010-138327, filed on Jun. 17, 2010, and Japanese Patent Application No. 2011-104676, filed on May 9, 2011, the entire contents of which are hereby incorporated by reference.

What is claimed is:

1. An organic electroluminescence device comprising:
   a cathode;
   a stacked structure provided on the cathode and comprising an organic layer that comprises an organic light emitting layer; and
   a transparent anode provided on the stacked structure and comprising metal oxide nano-particles and a conductive polymer,
   wherein a gap between the metal oxide nano-particles is filled by the conductive polymer, and
   wherein the metal oxide nano-particles make contact with the conductive polymer.

2. The organic electroluminescence device as claimed in claim 1, wherein the anode is formed by a mixture of the metal oxide and the conductive polymer.

3. The organic electroluminescence device as claimed in claim 2, wherein the anode is made of a liquid that is a mixture of a liquid comprising the metal oxide and a liquid comprising the conductive polymer.

4. The organic electroluminescence device as claimed in claim 1, which further comprises a hole injecting layer, a hole transport layer, an electron blocking layer, an organic light emitting layer, a hole blocking layer, an electron transport layer and an electron injecting layer and has the following layer structure:
   Anode/Hole Injecting Layer/Hole Transport Layer/Electron Blocking Layer/Organic Light Emitting Layer/Hole Blocking Layer/Electron Transport Layer/Electron Injecting Layer/Cathode.

5. The organic electroluminescence device as claimed in claim 1, wherein the conductive polymer comprises one or more of polythiophene, polyaniline, polypyrrole, and derivatives thereof.

6. A light emission apparatus, comprising:
   a substrate; and
   an organic electroluminescence device provided on the substrate,
   said organic electroluminescence device comprising:
   a cathode provided on the substrate;
   a stacked structure provided on the cathode and comprising an organic layer that comprises an organic light emitting layer; and
   a transparent anode provided on the stacked structure and comprising metal oxide nano particles and a conductive polymer,
   wherein a gap between the metal oxide nano-particles is filled by the conductive polymer, and
   wherein the metal oxide nano-particles make contact with the conductive polymer.

7. The light emission apparatus as claimed in claim 6, wherein the organic electroluminescence device further comprises:

a wiring provided on the substrate and electrically connected to the cathode; and a pixel separation layer covering the cathode and the wiring, and having an opening exposing a portion of the cathode, wherein the stacked structure is provided within the opening of the pixel separation layer.

8. The light emission apparatus as claimed in claim 6, wherein the organic electroluminescence device further comprises:
- a TFT (Thin Film Transistor) circuit provided on the substrate;
- a planarization layer provided on the TFT circuit and including a penetration electrode penetrating the planarization layer;
- a pixel separation layer covering the cathode and having an opening exposing a portion of the cathode, wherein the penetration electrode electrically connects the cathode and the TFT circuit, and the stacked structure is provided within the opening of the pixel separation layer.

9. The emission apparatus as claimed in claim 6, wherein the organic electroluminescence device further comprises a hole injecting layer, a hole transport layer, an electron blocking layer, an organic light emitting layer, a hole blocking layer, an electron transport layer and an electron injecting layer and has the following layer structure:

Anode/Hole Injecting Layer/Hole Transport Layer/Electron Blocking Layer/Organic Light Emitting Layer/Hole Blocking Layer/Electron Transport Layer/Electron Injecting Layer/Cathode.

10. The emission apparatus as claimed in claim 6, wherein the conductive polymer comprises one or more of polythiophene, polyaniline, polypyrrole and derivatives thereof.

* * * * *